US005623419A

United States Patent [19]

Kundert

[11] Patent Number: 5,623,419
[45] Date of Patent: Apr. 22, 1997

[54] MODELING OF MULTI-DISCIPLINARY SIGNALS

[75] Inventor: Kenneth S. Kundert, Belmont, Calif.

[73] Assignee: Cadence Design Systems, Inc., San Jose, Calif.

[21] Appl. No.: 234,284

[22] Filed: Apr. 28, 1994

[51] Int. Cl.⁶ .............................. G06F 15/00; G06F 19/00
[52] U.S. Cl. ..................... 364/490; 364/488; 364/489; 364/578; 395/76; 395/61; 395/500; 395/348
[58] Field of Search ................................ 364/578, 801, 364/916, 917.3, 490; 395/500, 650, 76, 159, 61, 10

[56] References Cited

U.S. PATENT DOCUMENTS

| | | | |
|---|---|---|---|
| 4,587,625 | 5/1986 | Marino, Jr. et al. | 364/578 |
| 4,656,603 | 4/1987 | Dunn | 364/916 |
| 4,677,587 | 6/1987 | Zemany, Jr. | 395/500 |
| 4,775,950 | 10/1988 | Terada et al. | 364/578 |
| 4,792,913 | 12/1988 | Buckland et al. | 364/801 |
| 4,864,497 | 9/1989 | Lowry et al. | 395/650 |
| 4,868,770 | 9/1989 | Us | 364/578 |
| 5,092,780 | 3/1992 | Vlach | 434/433 |
| 5,163,016 | 11/1992 | Har'El et al. | 364/578 |
| 5,363,320 | 11/1994 | Boyle et al. | 364/578 |
| 5,377,308 | 12/1994 | Inoue et al. | 395/61 |

FOREIGN PATENT DOCUMENTS

0490478A2 10/1991 European Pat. Off. ........ G06F 15/60

OTHER PUBLICATIONS

IEEE VHDL PAR 1075.1/Language Extension Specification, Feb. 8, 1993.
IEEE Proceedings International Symposium on Circuits and Systems, Jun. 7, 1988, Espoo Finland, pp. 893–896, Peter Odryna., "*A Unified Mixed–mode Digital/Analog Simulation Environment*".

Primary Examiner—Kevin J. Teska
Assistant Examiner—Thai Phan
Attorney, Agent, or Firm—Townsend and Townsend and Crew LLP

[57] ABSTRACT

A computer-aided engineering and design (CAE/CAD) tool for defining and verifying a system definition provides an improved technique for modeling multi-disciplinary signals. Terminals within the system definition have associated quantities (voltage, current, energy, velocity, flux, flow, acceleration, heat, weight, length, etc.) from diverse disciplines (e.g., electrical, mechanical, thermal, optical, chemical, and fluidic etc.). A strength (e.g., "indifferent", "suggest", "insist", or "overide") is also associated with each terminal. The quantities of each terminal are nominated to be the quantities of a node the terminal is connected to. When conflicting quantities are assigned to a common node in the system (i.e., a plurality of terminals with different associated quantities connect to the same node), rules based on the associated terminal strengths are applied to resolve the conflict. An initial node quantity and node strength are assigned to the common node based on the resolution of the conflict. Node quantities are then propagated through their associated terminals and through connecting branches to other terminals and nodes. When conflicting initial quantities exist in a common branch that connects a plurality of nodes, rules based on the associated initial node strengths are applied to resolve the conflict. Finally, internal signals of components inherit the quantities of the nodes they are associated with.

26 Claims, 5 Drawing Sheets

MODELING OF MULTI-DISCIPLINARY SIGNALS

BACKGROUND OF THE INVENTION

1. Field of the Invention

The invention relates to automated design systems, particularly to such systems for modeling and simulating systems with multi-disciplinary signals therein.

2. Background of the Invention

Computer-aided engineering and design (CAE/CAD) software and hardware tools are used for automating the process of defining (i.e., "modeling") and verifying (i.e., "simulating") prototype system designs. Most CAE/CAD tools are designed to function in substantially a single discipline using a limited set of signal types or quantities—typically the electrical discipline using voltage and/or current signal types. However, modeling languages allow users to describe models for components from any technical discipline, including electrical, mechanical, thermal, optical, chemical, and fluidic technologies. A modeling language should support models developed for particular disciplines, and should also support models that can be used in any discipline.

To enable multi-disciplinary system design, however, it is necessary, among other things, to support the modeling of various signal types or "quantities", such as voltage, current, energy, velocity, flux, flow, acceleration, heat, weight, length, and the like, at interconnection points or nodes in the system design. In addition, a simulator generally needs a rough estimate of how large the signals are expected to be (e.g., $10^{6}$-amperes and $10^{9}$ grams). Accordingly, there is a need for an improved tool to model signals with various different quantities.

SUMMARY OF INVENTION

The invention resides in a computer-automated system for modeling a system comprising a first terminal with an associated first quantity and a first strength and a second terminal with an associated second quantity and a second strength. Terminal quantities are nominated to nodes that the terminal is connected to. When conflicting quantities are nominated to a common node in the system (i.e., a plurality of terminals with different associated quantities connect to the same node), rules based on the associated terminal strengths are is applied to resolve the conflict. An initial node quantity and node strength are assigned to the common node based on the resolution of the conflict. Node quantities are then propagated through terminals and connecting branches to other terminals and nodes. When conflicting initial quantities exist in a common branch that connects a plurality of nodes, rules based on the associated initial node strengths are applied to resolve the conflict. Finally, internal signals of a component inherit the quantity of the nodes the component is connected to.

DETAILED DESCRIPTION OF THE PREFERRED EMBODIMENTS

Figure 1:
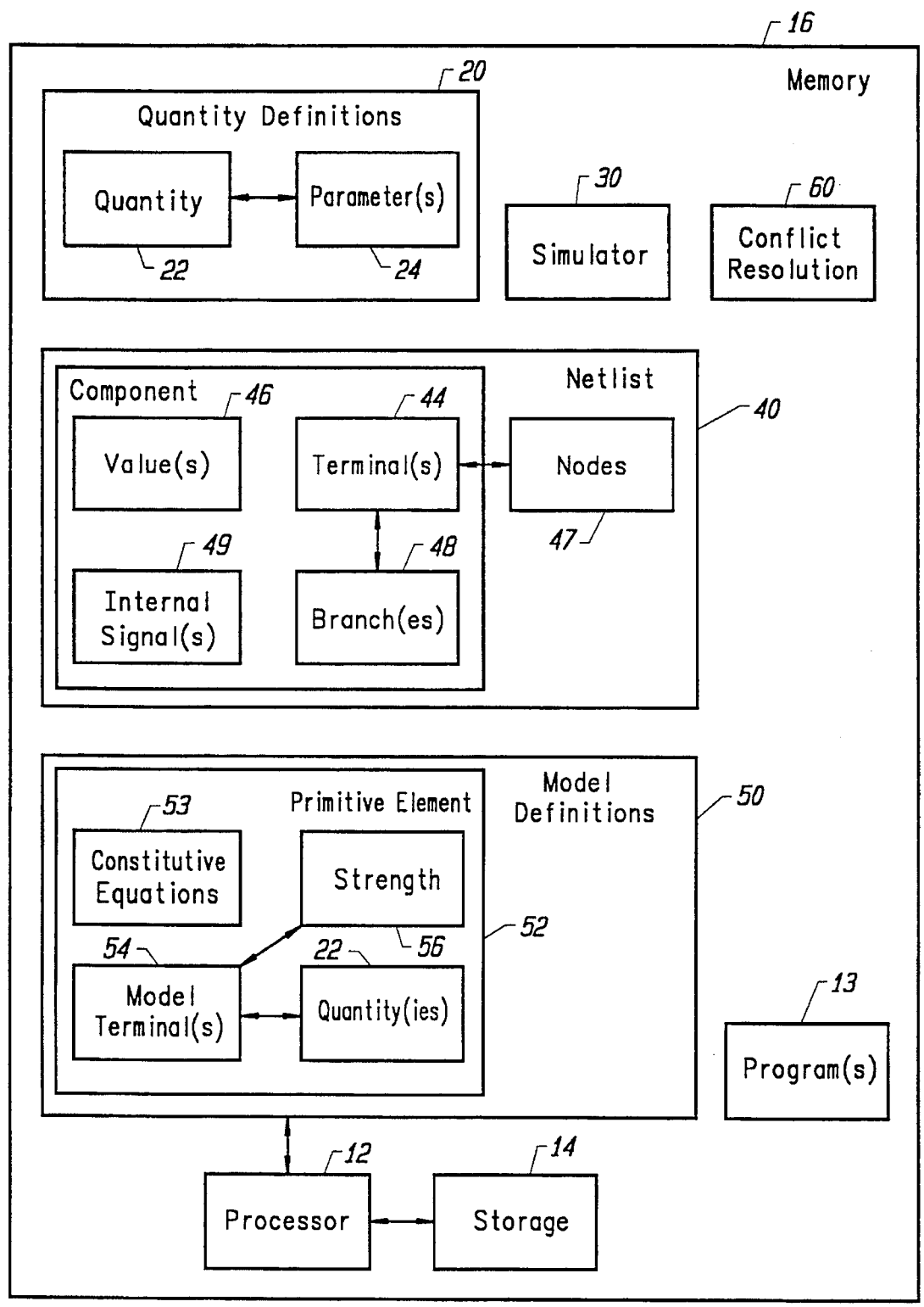
FIG. 1 is a simplified block diagram of one embodiment of a computer-based electronic design automation (EDA) tool for implementing the present invention.

FIG. 1 shows a block diagram of one embodiment of integrated software and hardware tools for implementing the present invention 10. The preferred embodiment may be implemented in a computer aided-engineering and/or design (CAE/CAD) system. Engineering workstation or other conventional processor 12 may also be coupled to other processors accessible over conventional communication channels or buses (not shown). Processor 12 is conventionally coupled to storage 14 which may be magnetic disk storage, a CD storage unit, or other conventional computer data storage unit. Processor 12 is also coupled to memory 16. Memory 16 may be a random access memory (RAM) unit or other conventional computer memory. Items in memory 16 may alternatively be stored in storage 14 and accessed by processor 12 when required. If sufficient memory 16 is provided, storage 14 is not essential. Memory 14 may comprise, among other items, program 13, quantity definitions 20, simulator 30, structural models or netlist 40, behavioral models or model definitions 50, and conflict resolution 60. Program 13 may comprise subprograms or modules that define executable instructions for execution on processor 12 in memory 16. Program 13 may also be stored in storage 14.

Quantity definitions 20 are defined for each signal type in the system to be modeled (e.g., voltage, current, force, velocity, acceleration, pressure, heat, flow, etc.). Each quantity definition 20 comprises a quantity or name 22 (e.g., "voltage", "current", "velocity"). Additionally, each quantity 22 may be associated with one or more parameters such as units (e.g., "v" for volts, "A" for amperes, "m/s" for meters per second), scale factor, absolute minimum/maximum tolerance, or other parameters 24 that describe general features of a quantity 22. Associations between quantities 22 and parameters 24 are conventionally made in memory 16 by processor 12 in conjunction with software running thereon.

Simulator 30 may be a software program and/or hardware accelerator which cooperates with, or is executed by, processor 12. Simulator 30 may be a conventional simulation environment such as Spectre, VHDL, or SPICE. As should be known or obvious to persons ordinarily skilled in the relevant art, simulator 30 serves to predict or verify behavior or functional output of systems in response to applied stimuli or input signals given a structural description of the components in the system and a behavioral description of each primitive element in the system.

Netlist 40 is generally a list of all of the components in the system (e.g., components such as voltage source V2, resistor R3, spring S32, flow source F2 where V2, R3, S32, and F2 are hypothetical designations). In FIG. 1 an example component 42 comprising various associated elements is shown. Netlist 40 may contain multiple instances of such a component 42, and numerous variations thereof. Components 42 may also be composite components that comprise other components or subcomponents 42. Component 42 may comprise, for example, terminal(s) 44 which connect to nodes 47. Component 42 may comprise any number of terminals 44 and may be connected to any number of nodes 47. A node 47 is a point of interconnection between one or more components 42. A component 42 connects to nodes 47 through its terminals 44. Any number of terminals 44 (and therefore any number of components 42) can be connected to the same node 47. A branch 48 defines a path between two terminals 44 of a component 42 that connect to two nodes 47. Generally, nodes 47 connected to a common branch (path) 48 must have the same quantities 22 for meaningful simulation. Netlist 40 may also comprises certain parametric information or values 46 associated with each component (e.g., "5" ohms). Components 42 may also comprise internal signals 49. Netlist 40 may be specified in model definitions 50, a schematic, or memory. Associations between elements of a component 42, components 42, elements of netlist 40, and other elements in memory 16 are conventionally made in memory 16 by processor 12 in conjunction with software running thereon.

Behavioral model or model definitions 50, describes the behavior of each primitive element 52 (e.g., voltage sources, resistors, springs, flow sources). In FIG. 1 an example primitive element 52 comprising various associated elements is shown. Model definitions 50 may contain multiple primitive elements 52 and numerous variations thereof. Generally, each primitive element 52 comprises constitutive relations or mathematical models/equations 53 (e.g., v=iR) that describe the behavior of each primitive element 52. In the present invention, each primitive element 52 also comprises model terminal definition(s) 54 associated with each primitive element 52; one or more quantities 22 associated with each model terminal 54; and, a strength 56 associated with each model terminal 54. Additionally, a list of nodes 47 and associated quantities 22 (if any) of each node and a list of branches 48, including the name of the model terminals 54 or nodes 47 to which each end of the branch connects may be specified in model definitions 50 (not shown). Behavioral models for each primitive element 52 may be supplied by the user, retrieved from a library, built-in to the simulator 30, specified in netlist 40, or specified in a behavioral modeling language, for example SpectreHDL. Associations between elements of primitive elements 52, primitive elements 52, elements of model definitions 50, and other elements in the memory 16 are conventionally made in memory 16 by processor 12 in conjunction with software running thereon.

In the preferred embodiment of the present invention, one or more quantities 22 may be associated with each model terminal 54 of each primitive element 52 modeled. For example, a model terminal 54 of a "resistor" primitive element 52 may be associated with "voltage" and "current" quantities 22. Similarly, a model terminal 54 of a magnetic core primitive element 52 may be associated with "MMF" and "flux" quantities 22, a model terminal 54 of a spring primitive 52 may be associated with "displacement" and "force" quantities 22, and so on. In one embodiment, two quantities 22 are associated with each model terminal 54 of each primitive element 52 in model definitions 50. In this case, each model terminal 54 generally has an associated "potential" or "across" quantity 22 (e.g., voltage, MMF, displacement) and a "flow" or "through" quantity 22 (e.g., current, flux, force).

The quantities 22 associated with each model terminal 54 are also associated with the component terminals 44 of each component 42 that names, specifies, or uses that type of primitive element 52. For example, if component "R23" 42 is associated with the "resistor" primitive 52, and if the "resistor" primitive 52 has a model terminal 54 associated with "voltage" and "current" quantities 22, then the terminals 44 of component 42 will also be associated with "voltage" and "current" quantities 22. See FIG. 4 for an illustrative example (explained in further detail below).

Additionally, each model terminal 54 may be associated with one or more strengths 56. Possible strengths 56 are, for example, "indifferent"(low strength), "suggest"medium strength), "insist"(high strength), or "override" (highest strength) and may be designated, for example, as 0, 1, 2, 3, respectively. Strengths 56 define how strong the quantities 22 should be associated with each model terminal 54 (and thus how strong the quantities 22 should be associated with a specific component terminal 44 that names the primitive 52). See FIG. 4 for an illustrative example (explained in further detail below). A strength 56 for model terminal 54 is not necessary and can be unspecified.

Figure 2:
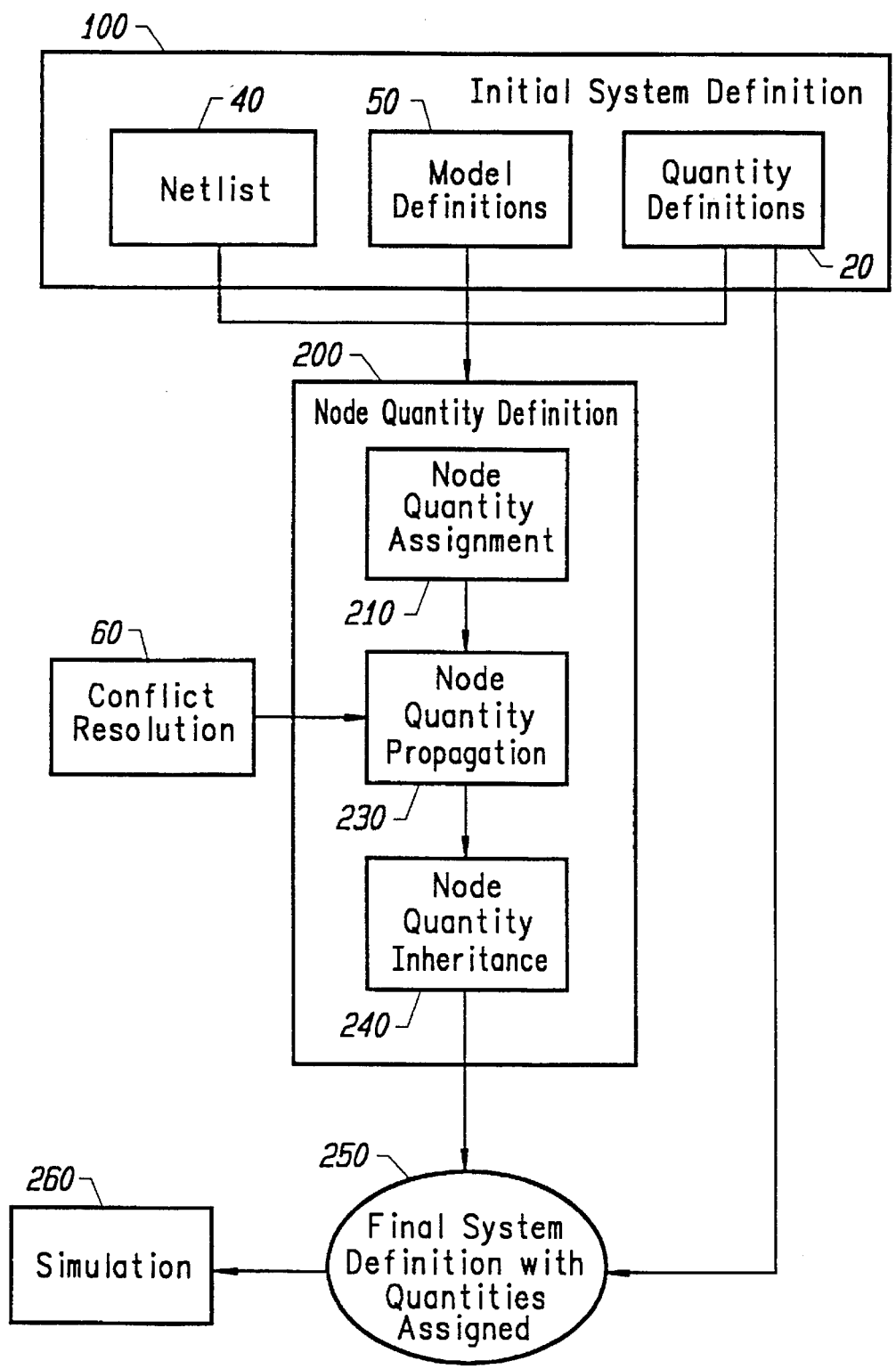
FIG. 2 is a high-level flow chart depicting one embodiment of the quantity definition process of the present invention.

Referring now to FIG. 2, a high level flowchart depicting the node quantity definition process for each node in system definition 100 is shown. Initial system definition 100 is specified as described above, i.e., quantity definitions 20, netlist 40, and model definitions 50 are specified including quantities 22, parameters 24, primitives 52, model terminals 54, strengths 56, components 42, terminals 44, values 46, nodes 47, and branches 48. Initial system definition 100 may be supplied by the user, retrieved from a library, built-in to the simulator 30 (e.g., Spectre), specified in netlist 40, and/or specified in modeling language (e.g., SpectreHDL).

The node quantity definition process 200 comprises node quantity assignment 210, node quantity propagation 230, and node quantity inheritance 240. Conflict resolution 60 is used to determine node quantities 200. Each of the processes 60, 100, 210, 230, 240 may be defined in programs or modules 13 executable on processor 12 in memory 16. After node quantities are determined 200, the final system definition 250 can be used, for example, in simulation 260.

Figure 3:
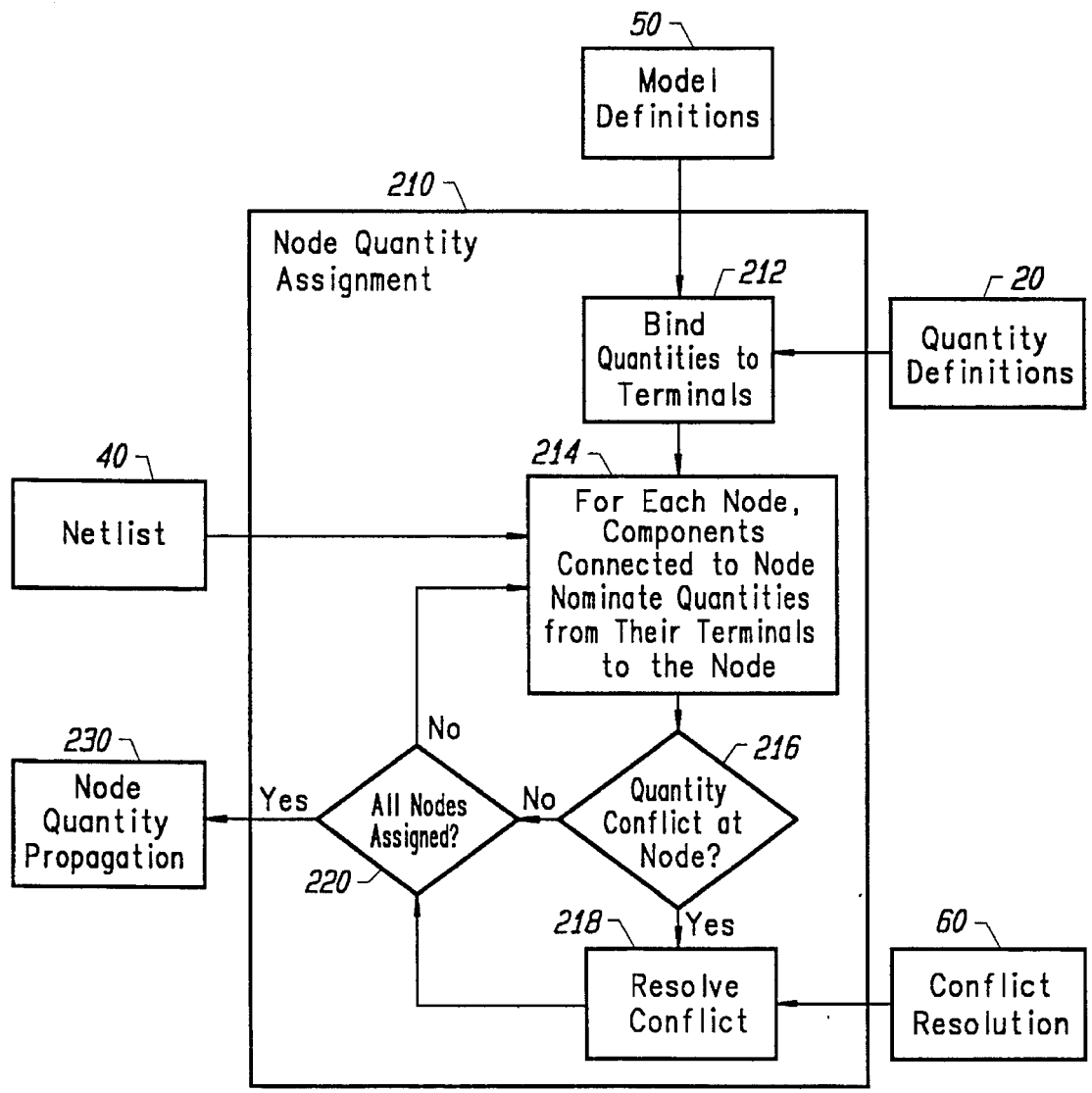
FIG. 3 is a flow chart depicting one embodiment of the quantity assignment process of the present invention.

FIG. 3 is a flow chart depicting one embodiment of the quantity assignment process 210 of the present invention. Quantities 22 and strengths 56 associated with each model terminal 54 are bound 212 to the respective terminals 44 of components 42. For example, if component R1 is a "resistor" 42 having terminals T1 and T2 44, and the resistor primitive 52 has model terminal 54 associated with quantities "voltage" and "current" 22 and strength "suggest" 56, then the terminals T1 and T2 44 will be also be bound to quantities "voltage" and "current" 22 with strength "suggest" 56. This binding is illustratively shown in FIG. 4 by arrows that connect quantities 22 and the strengths 56 to their respective terminals 44.

For each node 47, components 42 connected via their terminals 44 to the node "nominate" 214 the quantities 22 from their terminals 44 to the node 47. For example, if components R1 and R2 have terminals T1 and T2, respectively, and T1 and T2 are both connected to node N1, then the quantities associated with (bound to) T1 and T2 will be nominated for use at node N1.

If a conflict 216 occurs at a common node 47 (e.g., conflicting quantities 22 associated with a plurality of connecting terminals 44 are nominated to a node 47), conflict resolution rules 60 are used to resolve the conflict 218. Conflict resolution rules 60 are based on, among other things, the strengths 56 associated with each terminal 44.

Figure 4:
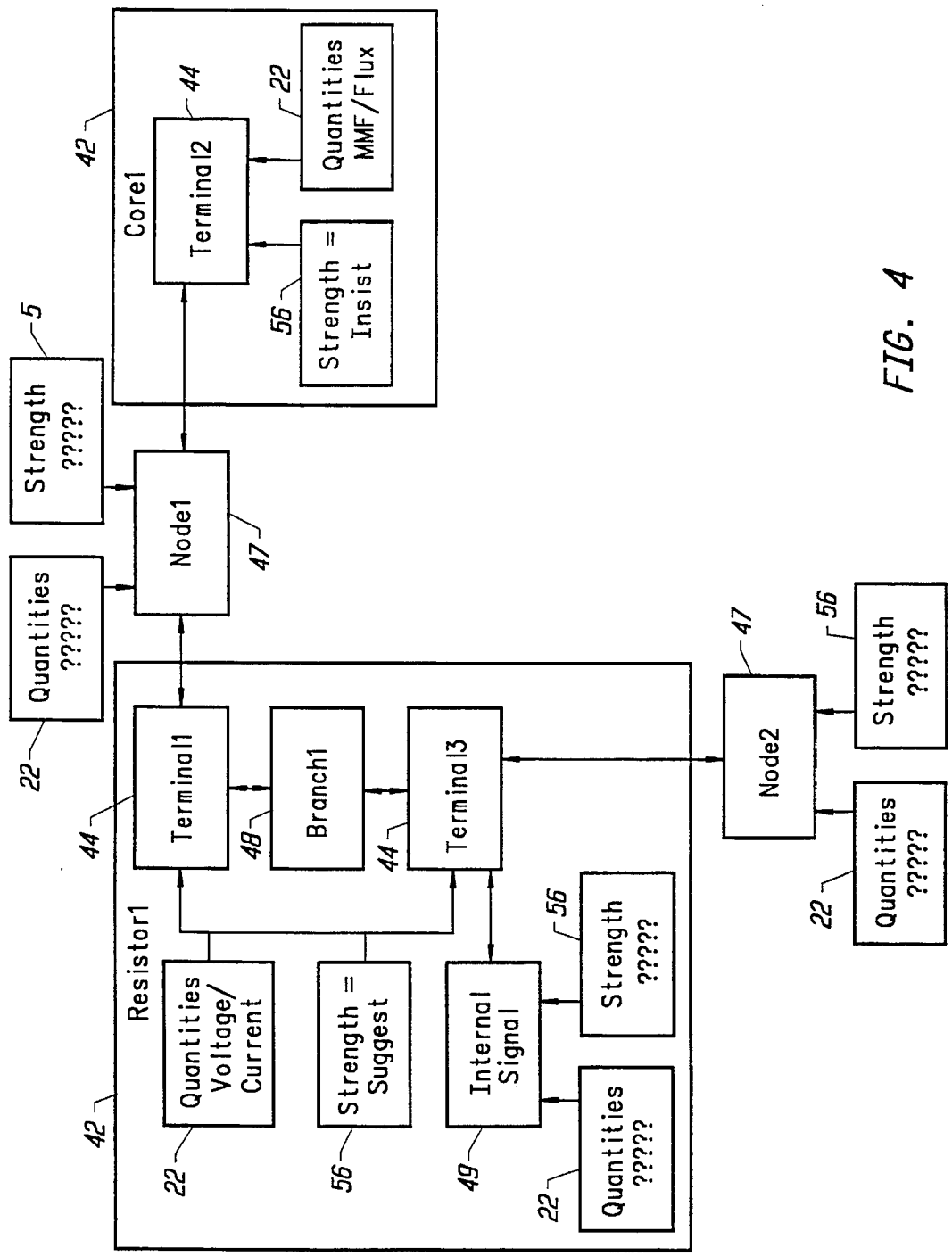
FIG. 4 is a hypothetical abstract system definition model as used in the present invention.

For example purposes, a hypothetical abstract system definition model is shown in FIG. 4. If component Resistor1 (42) having terminal Terminal1 (44) with quantities voltage and current (22) and strength "suggest"(56) is connected to node Node1 (47), and component Core1 (42) having terminal Terminal2 (44) with quantities MMF and flux (22) and strength "insist"(56) is also connected to Node1 (47), then Node 1 (47) will be assigned quantities MMF and flux (22) with a strength "insist"56) because a "insist" strength is, for example, stronger than "suggest" strength.

Each node is similarly processed until all nodes have an initial node quantity assignment 220. Initially assigned node quantities 22 are then propagated through their connecting branches to other nodes 230.

Figure 5:
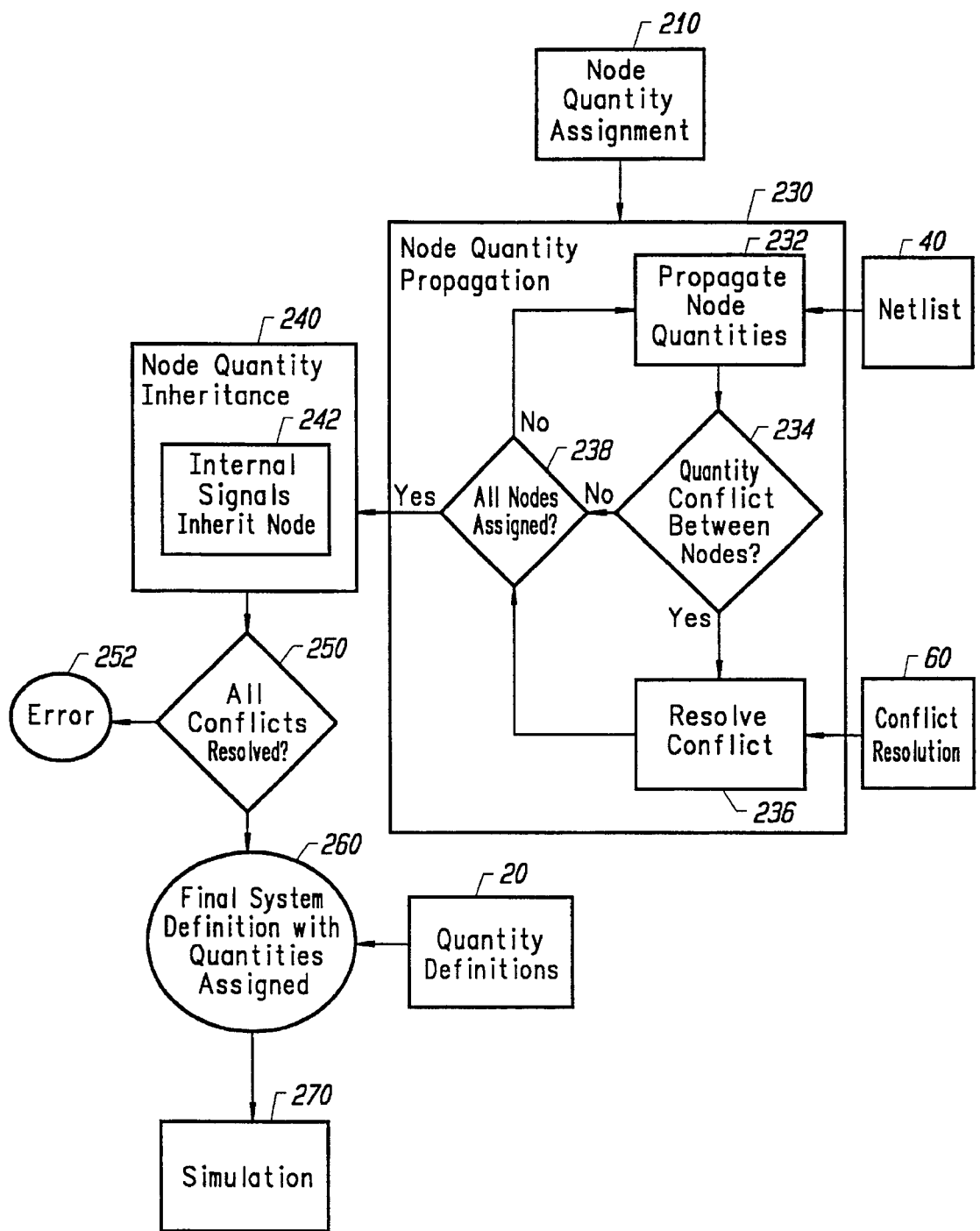
FIG. 5 is a flow chart depicting one embodiment of the quantity propagation and quantity inheritance processes of the present invention.

Referring now to FIG. 5, after all nodes have initial quantity assignments 210, the quantities 22 initially assigned to each node 47 are propagated 232 to other nodes 47 via their connecting terminals 44 and/or branches 48. If a conflict 234 occurs between nodes 47 (e.g., conflicting quantities 22 are associated with a plurality of nodes 47 connected through a common branch 48), conflict resolution rules 60 are used to resolve the conflict 236. Conflict resolution rules 60 are based on, among other things, the strengths 56 associated with each terminal 44. It is desirable to have a common quantity type 22 associated with the nodes 47 in each branch 48 in order to make meaningful calculations and/or simulation possible. Different branches 48 in the same system 100 can, however, have different quantities 22.

For example, in FIG. 4, branch Branch1 in component Resistor1 is connected to node Node1 (via Terminal1) and node Node2 (via Terminal3). The is initially assigned quantities at Node 1, MMF and flux with strength "insist", are propagated through Terminal1, Branch1, and Terminal3 to Node2. If Node2 is initially assigned quantities voltage and current with strength "suggest"(not shown), then Node2 will be changed to quantities MMF and flux with a strength "insist" because a "insist" strength is, for example, stronger than "suggest" strength. Each node is similarly processed until all nodes have a node quantity assignment 238. Node quantities are then inherited 240 by their internal signals, if any.

Internal signals 49 of components 42 "inherit" 242 the quantities 22 assigned to their associated nodes 47. For example, a voltage source, V1, having an internal signal called "current signal." V1 may be connected to a node 47 (via terminal 44) having assigned node quantities MMF and flux. Thus, internal signal "current signal" 49 will have quantities MMF and flux imposed on it 242. For example, in FIG. 4 internal signal 49 may be assigned MMF and flux quantities 22.

If conflicts in node quantity definitions remain in the system definition 250, an error 252 may be reported. For example, if equal strengths 56 associated with a plurality of terminals 44 with different associated quantities 22 are connected to a common node 47, the system may note this unresolved conflict and report an error 252. Processing can continue or be aborted. Alternatively, error reporting can be made immediately when an unresolved conflict is detected. Other user defined rules or preferred quantities can also be made. For example, a user may specify a global environment preference for "voltage" and "current" quantities 22 when the system cannot resolve the conflict (e.g., 218, 236) using strengths 56.

Thus, employing to the present invention, a final system definition with quantities assigned to nodes is generated 260. Quantity definitions 22 (e.g., quantity parameters 24) are incorporated into the system definition 260. Subsequent simulation 270 can be also be performed. In this respect, the present invention can also be used to "translate" a system definition 100 with quantities defined at terminals to a system definition with quantities defined at nodes 260. The translated system definition 260 can then be used in a simulation 270 that requires quantities defined at the node.

I claim:

1. An integrated circuit produced in accordance with a method comprising the steps of:

receiving an initial system definition comprising a first and second terminal, a first and second quantity, a first association strength, a second association strength, and a node, wherein the first and second terminals are associated with the node;

modifying the initial system definition, wherein the first quantity and the first association strength are associated with the first terminal, and the second quantity and the second association strength are associated with the second terminal, the first association strength indicating a strength of association between the first terminal and the first quantity, and the second association strength indicating a strength of association between the second terminal and the second quantity;

determining whether there is a node conflict between the first terminal and the second terminal, in response to the first terminal and the second terminal;

resolving the node conflict by generating a modified system definition wherein the first quantity is associated with the node when the first association strength is stronger than the second association strength; and producing an integrated circuit based on the modified system definition.

2. The method of claim 1 wherein the first quantity comprises a current quantity.

3. The method of claim 1 wherein the first quantity is associated with a plurality of parameters.

4. The method of claim 3 wherein the parameters comprise an absolute tolerance parameter.

5. The method of claim 3 wherein the parameters comprise a unit parameter.

6. The method of claim 1 wherein the first terminal is associated with at least two association strengths.

7. The method of claim 1 wherein the step of determining comprises the step of:

determining whether there is a node conflict between the first quantity associated with the first terminal and the second quantity associated with the second terminal, the node conflict indicated when the first quantity and the second quantity are different.

8. A method implemented on a computer system for modeling a system, comprising the steps of:

receiving a system definition including a first terminal, a first quantity, a first association strength, a second terminal, a second quantity, a second association strength, and a node;

associating the first quantity and the first association strength to the first terminal, the first association strength indicating a strength of association between the first terminal and the first quantity;

associating the second quantity and the second association strength to the second terminal, the second association strength indicating a strength of association between the second terminal and the second quantity;

associating the first terminal and a second terminal to the node;

determining when a node conflict is indicated between the first quantity associated with the first terminal, and the second quantity a associated with the second terminal;

resolving the node conflict by:
  binding the first quantity to the node as a node quantity in response to the first association strength and the second association strength; and
  binding the first association strength to the node as a node association strength in response to the first association strength and the second association strength, the node association strength indicating a strength of association between the node and the node quantity; and
simulating the system using the node quantity and the node association strength.

9. The method of claim 8 wherein a netlist file provides the system definition.

10. The method of claim 8 wherein the first quantity comprises a voltage quantity.

11. The method of claim 8 wherein the first terminal is associated with at least two quantities.

12. The method of claim 11 wherein the first terminal is associated with a potential quantity and a flow quantity.

13. The signal modeling method of claim 8 wherein the first association strength comprises an association strength from the set of "indifferent", "suggest", "insist", and "override".

14. The method of claim 8 wherein the first quantity corresponds to a first discipline, and the second quantity corresponds to a second discipline.

15. The method of claim 14 wherein the first and second disciplines are different.

16. The method of claim 8, wherein another node is provided having a third quantity and a third association strength, the third association strength indicating a strength of association between the third terminal and the third quantity, the method comprising the steps of:
  associating the node to the another node;
  binding the third quantity to the node as the node quantity in response to the third association strength and the node association strength;
  binding the third association strength to the node as the node association strength in response to the third association strength and the node association strength.

17. The method of claim 8, wherein the step of binding the first quantity comprises binding the first quantity to the node as the node quantity in response to a comparison of the first association strength and the second association strength; and
  wherein the step of binding the first association strength comprises binding the first association strength to the node as the node association strength in response to the comparison of the first association strength and the second association strength.

18. The method of claim 8, wherein the step of binding first quantity comprises binding the first quantity to the node as the node quantity when the first association strength exceeds the second association strength; and
  wherein the step of binding the first association strength comprises binding the first association strength to the node as the node association strength when the first association strength exceeds the second association strength.

19. A circuit produced in accordance with the method of claim 8.

20. A computer system including a computer program for modeling a system, the computer system comprising:
  a computer-readable memory including:
    code that receives a system definition including a first terminal, a first quantity, a first association strength, a second terminal, a second quantity, a second association strength, and a node;
    code that associates the first quantity and the first association strength to the first terminal, the first association strength indicating a strength of association between the first terminal and the first quantity;
    code that associates the second quantity and the second association strength to the second terminal, the second association strength indicating a strength of association between the second terminal and the second quantity;
    code that associates the first terminal and a second terminal to the node;
    code that binds the first quantity to the node as a node quantity in response to the first association strength and the second association strength;
    code that binds the first association strength to the node as a node association strength in response to the first association strength and the second association strength; and
    code that simulates the system using the node quantity and the node association strength.

21. A computer system configured for modeling a system, the computer system comprising:
  a receiver for receiving a system definition including a first terminal, a first quantity, a first association strength, a second terminal, a second quantity, a second association strength, and a node;
  an associator for associating the first quantity and the first association strength to the first terminal, the first association strength indicating a strength of association between the first terminal and the first quantity;
  an associator for associating the second quantity and the second association strength to the second terminal, the second association strength indicating a strength of association between the second terminal and the second quantity;
  an associator for associating the first terminal and a second terminal to the node;
  a binder for binding the first quantity to the node as a node quantity in response to the first association strength and the second association strength;
  a binder for binding the first association strength to the node as a node association strength in response to the first association strength and the second association strength; and
  a simulator for simulating the system using the node quantity and the node association strength.

22. A method implemented on a computer system for modeling a system, comprising the steps of:
  receiving a system definition including a first terminal, a first quantity, a first association strength, a second terminal, a second quantity, a second association strength, a third terminal, a third quantity, a third association strength, a fourth terminal, a fourth quantity, a fourth association strength, a first node, and a second node;
  associating the first quantity and the first association strength to the first terminal, the first association strength indicating a strength of association between the first terminal and the first quantity;
  associating the second quantity and the second association strength to the second terminal, the second association strength indicating a strength of association between the second terminal and the second quantity;

associating the first terminal and a second terminal to the first node;

binding the first quantity to the first node as a first node quantity when the first association strength exceeds the second association strength;

binding the first association strength to the first node as a first node association strength when the first association strength exceeds the second association strength, the first node association strength indicating a strength of association between the first node and the first node quantity;

binding the second quantity to the first node as the first node quantity when the second association strength exceeds the first association strength;

binding the second association strength to the first node as the first node association strength when the second association strength exceeds the first association strength;

associating the third quantity and the third association strength to the third terminal, the third association strength indicating a strength of association between the third terminal and the third quantity;

associating the fourth quantity and the fourth association strength to the fourth terminal, the fourth association strength indicating a strength of association between the fourth terminal and the fourth quantity;

associating the third terminal and a fourth terminal to the second node;

binding the third quantity to the second node as a second node quantity when the third association strength exceeds the fourth association strength;

binding the third association strength to the second node as a second node association strength when the third association strength exceeds the fourth association strength, the second node association strength indicating a strength of association between the second node and the second node quantity;

binding the fourth quantity to the second node as the second node quantity when the fourth association strength exceeds the third association strength;

binding the fourth association strength to the second node as the second node association strength when the fourth association strength exceeds the third association strength;

associating the first node to the second node;

binding the first node quantity to the second node when the first node association strength exceeds the second node association strength;

binding the first node association strength to the second node when the first node association strength exceeds the second node association strength;

binding the second node quantity to the first node as the first node quantity when the second node association strength exceeds the first node association strength;

binding the second node association strength to the first node as the first node association strength when the second node association strength exceeds the first node association strength; and simulating the system using the first node quantity, the first node association strength the second node quantity, and the second node association strength.

23. The method of claim 22 wherein the first node is associated with the second node via a branch.

24. The method of claim 22 further comprising the step of:

determining when a conflict is indicated between the first node quantity associated with the first node and the second node quantity associated with the second node.

25. The method of claim 24 wherein a conflict is indicated when the first node quantity associated with the first node and the second node quantity associated with the second node are different.

26. The method of claim 22 wherein the first node is associated with an internal signal, and wherein the step of binding the first quantity to the first node further comprises the step of binding the first quantity with the internal signal to generate a modified system definition.

* * * * *